(12) United States Patent
Cady et al.

(10) Patent No.: US 7,094,632 B2
(45) Date of Patent: Aug. 22, 2006

(54) LOW PROFILE CHIP SCALE STACKING SYSTEM AND METHOD

(75) Inventors: James W. Cady, Austin, TX (US); Julian Partridge, Austin, TX (US); James Douglas Wehrly, Jr., Austin, TX (US); James Wilder, Austin, TX (US); David L. Roper, Austin, TX (US); Jeff Buchle, Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

(21) Appl. No.: 10/873,847

(22) Filed: Jun. 22, 2004

(65) Prior Publication Data

US 2004/0229402 A1    Nov. 18, 2004

Related U.S. Application Data

(63) Continuation of application No. 10/631,886, filed on Jul. 11, 2003, now Pat. No. 7,026,708, which is a continuation-in-part of application No. 10/453,398, filed on Jun. 3, 2003, now Pat. No. 6,914,324, which is a continuation-in-part of application No. 10/005,581, filed on Oct. 26, 2001, now Pat. No. 6,576,992, application No. 10/631,886, which is a continuation-in-part of application No. 10/457,608, filed on Jun. 9, 2003, which is a continuation-in-part of application No. 10/005,581.

(51) Int. Cl.
*H01L 21/44* (2006.01)
*H01L 21/48* (2006.01)
*H01L 21/50* (2006.01)

(52) U.S. Cl. .............. 438/109; 438/106; 438/108; 257/686

(58) Field of Classification Search ............... 408/107, 408/108, 109; 257/686, 777, 778, 737–738; 361/735, 790, 767; 438/106, 108, 109
See application file for complete search history.

(56) References Cited

U.S. PATENT DOCUMENTS

| | | |
|---|---|---|
| 3,411,122 A | 11/1968 | Schiller et al. |
| 3,436,604 A | 4/1969 | Hyltin |
| 3,654,394 A | 4/1972 | Gordon |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 3,983,547 A | 9/1976 | Almasi |
| 4,079,511 A | 3/1978 | Grabbe |
| 4,103,318 A | 7/1978 | Schwede |
| 4,288,841 A | 9/1981 | Gogal |
| 4,398,235 A | 8/1983 | Lutz et al. |
| 4,406,508 A | 9/1983 | Sadigh-Behzadi |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |

| | | | | | |
|---|---|---|---|---|---|
| 5,057,903 A | 10/1991 | Olla | 5,631,193 A | 5/1997 | Burns |
| 5,064,782 A | 11/1991 | Rabinowitz | 5,642,055 A * | 6/1997 | Difrancesco ................ 324/757 |
| 5,068,708 A | 11/1991 | Newman | 5,644,161 A | 7/1997 | Burns |
| 5,081,067 A | 1/1992 | Shimizu et al. | 5,646,446 A | 7/1997 | Nicewarner, Jr. et al. |
| 5,099,393 A | 3/1992 | Bentlage et al. | 5,654,877 A | 8/1997 | Burns |
| 5,104,820 A | 4/1992 | Go et al. | 5,657,537 A | 8/1997 | Saia et al. |
| 5,117,282 A | 5/1992 | Salatino | 5,677,569 A | 10/1997 | Choi et al. |
| 5,122,862 A | 6/1992 | Kajihara et al. | 5,729,894 A | 3/1998 | Rostoker et al. |
| 5,138,430 A | 8/1992 | Gow, 3rd et al. | 5,744,827 A | 4/1998 | Jeong et al. |
| 5,138,434 A | 8/1992 | Wood et al. | 5,751,553 A | 5/1998 | Clayton |
| 5,158,912 A | 10/1992 | Kellerman et al. | 5,763,296 A | 6/1998 | Casati et al. |
| 5,159,434 A | 10/1992 | Kohno et al. | 5,764,497 A | 6/1998 | Mizumo |
| 5,159,535 A | 10/1992 | Desai et al. | 5,776,797 A * | 7/1998 | Nicewarner et al. ........ 438/107 |
| 5,168,926 A | 12/1992 | Watson et al. | 5,778,522 A | 7/1998 | Burns |
| 5,198,888 A | 3/1993 | Sugano et al. | 5,778,552 A | 7/1998 | Burns |
| 5,198,965 A | 3/1993 | Curtis et al. | 5,783,464 A | 7/1998 | Burns |
| 5,214,307 A | 5/1993 | Davis | 5,789,815 A | 8/1998 | Tessier et al. |
| 5,219,794 A | 6/1993 | Satoh et al. | 5,801,437 A | 9/1998 | Burns |
| 5,222,014 A | 6/1993 | Lin | 5,801,439 A | 9/1998 | Fujisawa et al. |
| 5,224,023 A | 6/1993 | Smith et al. | 5,804,870 A | 9/1998 | Burns |
| 5,229,916 A * | 7/1993 | Frankeny et al. ............ 361/718 | 5,805,422 A | 9/1998 | Otake et al. |
| 5,239,198 A | 8/1993 | Lin et al. | 5,828,125 A | 10/1998 | Burns |
| 5,240,588 A | 8/1993 | Uchida | 5,835,988 A | 11/1998 | Ishii |
| 5,241,454 A | 8/1993 | Ameen et al. | 5,841,721 A | 11/1998 | Kwon et al. |
| 5,243,133 A | 9/1993 | Engle et al. | 5,869,353 A | 2/1999 | Levy et al. |
| 5,247,423 A | 9/1993 | Lin et al. | 5,895,970 A * | 4/1999 | Miyoshi ..................... 257/696 |
| 5,252,855 A | 10/1993 | Ogawa et al. | 5,899,705 A | 5/1999 | Akram |
| 5,252,857 A | 10/1993 | Kane et al. | 5,917,709 A * | 6/1999 | Johnson et al. ............. 361/803 |
| 5,259,770 A | 11/1993 | Bates et al. | 5,922,061 A | 7/1999 | Robinson |
| 5,261,068 A | 11/1993 | Gaskins et al. | 5,925,934 A | 7/1999 | Lim |
| 5,262,927 A | 11/1993 | Chia et al. | 5,926,369 A | 7/1999 | Ingraham et al. |
| 5,276,418 A | 1/1994 | Klosowiak et al. | 5,949,657 A | 9/1999 | Karabatsos |
| 5,279,029 A | 1/1994 | Burns | 5,953,215 A | 9/1999 | Karabatsos |
| 5,281,852 A | 1/1994 | Normington | 5,959,839 A | 9/1999 | Gates |
| 5,289,062 A | 2/1994 | Wyland | 5,963,427 A | 10/1999 | Bollesen |
| 5,311,401 A | 5/1994 | Gates, Jr. et al. | 5,973,395 A | 10/1999 | Suzuki et al. |
| 5,313,097 A | 5/1994 | Haj-Ali-Ahmadi et al. | 5,995,370 A | 11/1999 | Nakamori |
| 5,343,075 A | 8/1994 | Nishino | 6,002,167 A | 12/1999 | Hatano et al. |
| 5,347,428 A | 9/1994 | Carson et al. | 6,002,589 A | 12/1999 | Perino et al. |
| 5,357,478 A | 10/1994 | Kikuda et al. | 6,014,316 A | 1/2000 | Eide |
| 5,361,228 A | 11/1994 | Adachi et al. | 6,025,642 A | 2/2000 | Burns |
| 5,375,041 A | 12/1994 | McMahon | 6,028,352 A | 2/2000 | Eide |
| 5,377,077 A | 12/1994 | Burns | 6,028,365 A | 2/2000 | Akram et al. |
| 5,386,341 A | 1/1995 | Olson et al. | 6,034,878 A | 3/2000 | Osaka et al. |
| 5,394,010 A | 2/1995 | Tazawa et al. | 6,040,624 A | 3/2000 | Chambers et al. |
| 5,394,303 A | 2/1995 | Yamaji | 6,072,233 A | 6/2000 | Corisis et al. |
| 5,397,916 A | 3/1995 | Normington | 6,084,293 A | 7/2000 | Ohuchi |
| 5,402,006 A | 3/1995 | O'Donley | 6,084,294 A | 7/2000 | Tomita |
| 5,420,751 A | 5/1995 | Burns | 6,097,087 A | 8/2000 | Farnworth et al. |
| 5,428,190 A | 6/1995 | Stopperan | 6,121,676 A | 9/2000 | Solberg |
| 5,438,224 A | 8/1995 | Papageorge et al. | RE36,916 E | 10/2000 | Moshayedi |
| 5,446,620 A | 8/1995 | Burns et al. | 6,157,541 A | 12/2000 | Hacke |
| 5,448,511 A | 9/1995 | Paurus et al. | 6,165,817 A * | 12/2000 | Akram et al. ................ 438/118 |
| 5,455,740 A | 10/1995 | Burns | 6,172,874 B1 | 1/2001 | Bartilson |
| 5,475,920 A | 12/1995 | Burns et al. | 6,178,093 B1 | 1/2001 | Bhatt et al. |
| 5,477,082 A | 12/1995 | Buckley, III et al. | 6,187,652 B1 | 2/2001 | Chou et al. |
| 5,479,318 A | 12/1995 | Burns | 6,205,654 B1 | 3/2001 | Burns |
| 5,484,959 A | 1/1996 | Burns | 6,208,521 B1 * | 3/2001 | Nakatsuka .................. 361/749 |
| 5,493,476 A | 2/1996 | Burns | 6,222,737 B1 | 4/2001 | Ross |
| 5,499,160 A | 3/1996 | Burns | 6,225,688 B1 | 5/2001 | Kim et al. |
| 5,502,333 A | 3/1996 | Bertin et al. | 6,233,650 B1 | 5/2001 | Johnson et al. |
| 5,514,907 A | 5/1996 | Moshayedi | 6,234,820 B1 | 5/2001 | Perino et al. |
| 5,523,619 A | 6/1996 | McAllister et al. | 6,262,476 B1 | 7/2001 | Vidal |
| 5,523,695 A | 6/1996 | Lin | 6,262,895 B1 | 7/2001 | Forthun |
| 5,541,812 A | 7/1996 | Burns | 6,265,660 B1 | 7/2001 | Tandy |
| 5,543,664 A | 8/1996 | Burns | 6,266,252 B1 | 7/2001 | Karabatsos |
| 5,561,591 A | 10/1996 | Burns | 6,281,577 B1 | 8/2001 | Oppermann et al. |
| 5,566,051 A | 10/1996 | Burns | 6,285,560 B1 | 9/2001 | Lyne |
| 5,572,065 A | 11/1996 | Burns | 6,288,907 B1 | 9/2001 | Burns |
| 5,588,205 A | 12/1996 | Roane | 6,300,679 B1 * | 10/2001 | Mukerji et al. ............. 257/738 |
| 5,592,364 A | 1/1997 | Roane | 6,303,981 B1 | 10/2001 | Moden |
| 5,594,275 A | 1/1997 | Kwon et al. | 6,310,392 B1 | 10/2001 | Burns |
| 5,612,570 A | 3/1997 | Eide et al. | 6,313,998 B1 | 11/2001 | Kledzik |

| | | | | | | |
|---|---|---|---|---|---|---|
| 6,316,825 B1 | 11/2001 | Park et al. | | 2002/0101261 A1 | 8/2002 | Karabatsos |
| 6,323,060 B1 | 11/2001 | Isaak | | 2002/0139577 A1 | 10/2002 | Miller |
| 6,329,708 B1 | 12/2001 | Komiyama | | 2002/0164838 A1 | 11/2002 | Moon et al. |
| 6,336,262 B1 | 1/2002 | Dalal et al. | | 2002/0180022 A1 | 12/2002 | Emoto |
| 6,351,029 B1 | 2/2002 | Isaak | | 2003/0016710 A1 | 1/2003 | Kamoto |
| 6,360,433 B1 | 3/2002 | Ross | | 2003/0045025 A1 | 3/2003 | Coyle et al. |
| 6,368,896 B1 | 4/2002 | Farnworth et al. | | 2003/0049886 A1 | 3/2003 | Salmon |
| 6,376,769 B1 | 4/2002 | Chung | | 2003/0081392 A1 | 5/2003 | Cady et al. |
| 6,392,162 B1 | 5/2002 | Karabatsos | | 2003/0082845 A1* | 5/2003 | Hoffman et al. ............ 438/106 |
| 6,410,857 B1* | 6/2002 | Gonya ........................ 174/254 | | 2003/0107118 A1 | 6/2003 | Pflughaupt et al. |
| 6,426,240 B1 | 7/2002 | Isaak | | 2003/0109078 A1 | 6/2003 | Takahashi et al. |
| 6,426,549 B1 | 7/2002 | Isaak | | 2003/0168725 A1 | 9/2003 | Warner et al. |
| 6,426,560 B1 | 7/2002 | Kawamura et al. | | 2004/0000708 A1 | 1/2004 | Rapport et al. |
| 6,433,418 B1 | 8/2002 | Fujisawa et al. | | 2004/0021211 A1 | 2/2004 | Damberg |
| 6,444,490 B1 | 9/2002 | Bertin et al. | | 2004/0031972 A1 | 2/2004 | Pflughaupt et al. |
| 6,444,921 B1 | 9/2002 | Wang et al. | | 2004/0045159 A1 | 3/2004 | DiStefano et al. |
| 6,446,158 B1 | 9/2002 | Karabatsos | | 2004/0065963 A1 | 4/2004 | Karnezos |
| 6,449,159 B1 | 9/2002 | Haba | | 2004/0075991 A1 | 4/2004 | Haba et al. |
| 6,452,826 B1 | 9/2002 | Kim et al. | | 2004/0099938 A1 | 5/2004 | Kang et al. |
| 6,462,412 B1 | 10/2002 | Kamei et al. | | 2004/0104470 A1 | 6/2004 | Bang et al. |
| 6,465,877 B1 | 10/2002 | Farnworth et al. | | 2004/0115866 A1 | 6/2004 | Bang et al. |
| 6,465,893 B1 | 10/2002 | Khandros et al. | | 2004/0150107 A1 | 8/2004 | Cha et al. |
| 6,473,308 B1 | 10/2002 | Forthun | | 2004/0157352 A1 | 8/2004 | Beroz et al. |
| 6,486,544 B1 | 11/2002 | Hashimoto | | 2004/0203190 A1 | 10/2004 | Pflughaupt et al. |
| 6,489,178 B1 | 12/2002 | Coyle et al. | | 2004/0217461 A1 | 11/2004 | Damberg |
| 6,489,687 B1* | 12/2002 | Hashimoto .................. 257/777 | | 2004/0217471 A1 | 11/2004 | Haba |
| 6,492,718 B1 | 12/2002 | Ohmori | | 2004/0238931 A1 | 12/2004 | Haba et al. |
| 6,509,639 B1 | 1/2003 | Lin | | 2004/0245617 A1 | 12/2004 | Damberg et al. |
| 6,514,793 B1 | 2/2003 | Isaak | | 2005/0018495 A1 | 1/2005 | Bhakta et al. |
| 6,528,870 B1 | 3/2003 | Fukatsu et al. | | 2005/0035440 A1 | 2/2005 | Mohammed |
| 6,552,910 B1 | 4/2003 | Moon et al. | | 2005/0040508 A1 | 2/2005 | Lee |
| 6,560,117 B1 | 5/2003 | Moon | | 2005/0133897 A1 | 6/2005 | Baek et al. |
| 6,572,387 B1 | 6/2003 | Burns et al. | | | | |
| 6,574,113 B1* | 6/2003 | Armezzani et al. ......... 361/767 | | FOREIGN PATENT DOCUMENTS | | |
| 6,576,992 B1 | 6/2003 | Cady et al. | | | | |
| 6,588,095 B1 | 7/2003 | Pan | | DE | 004215467 A1 | 11/1992 |
| 6,590,282 B1 | 7/2003 | Wang et al. | | DE | 004214102 A1 | 12/1992 |
| 6,600,222 B1 | 7/2003 | Levardo | | EP | 0426-303 (A2) | 10/1990 |
| 6,614,664 B1* | 9/2003 | Lee ............................. 361/784 | | EP | 461-639(A) | 12/1991 |
| 6,620,651 B1 | 9/2003 | He et al. | | JP | 359088863 (A) | 5/1984 |
| 6,627,984 B1 | 9/2003 | Bruce et al. | | JP | 60-254762 (A) | 12/1985 |
| 6,657,134 B1 | 12/2003 | Spielberger et al. | | JP | 3641047659 (A) | 3/1986 |
| 6,660,561 B1 | 12/2003 | Forthun et al. | | JP | 62-230027 (A) | 8/1987 |
| 6,661,247 B1* | 12/2003 | Maruyama et al. ......... 324/765 | | JP | 4-209562 (A) | 7/1992 |
| 6,677,670 B1 | 1/2004 | Kondo | | JP | 404368167 (A) | 12/1992 |
| 6,683,377 B1 | 1/2004 | Shim et al. | | JP | 50-29534 (A) | 2/1993 |
| 6,690,584 B1 | 2/2004 | Uzuka et al. | | JP | 63-153849 (A) | 6/1998 |
| 6,699,730 B1 | 3/2004 | Kim et al. | | JP | 2000-307029 (A) | 11/2000 |
| 6,707,684 B1 | 3/2004 | Andric et al. | | JP | 2001077294(A) | 3/2001 |
| 6,709,893 B1* | 3/2004 | Moden et al. .............. 438/113 | | JP | 2001085592(A) | 3/2001 |
| 6,768,660 B1 | 7/2004 | Kong et al. | | JP | 2001332683(A) | 11/2001 |
| 6,781,240 B1 | 8/2004 | Choi et al. | | JP | 2003037246(A) | 2/2003 |
| 6,803,651 B1 | 10/2004 | Chiang | | JP | 2003086760(A) | 3/2003 |
| 6,812,567 B1 | 11/2004 | Kim et al. | | JP | 2003086761(A) | 3/2003 |
| 6,833,984 B1 | 12/2004 | Belgacem | | JP | 2003/09247 (A) | 10/2003 |
| 6,849,949 B1 | 2/2005 | Lyu et al. | | JP | 2003309246(A) | 10/2003 |
| 6,867,496 B1* | 3/2005 | Hashimoto .................. 257/771 | | JP | 2003/347475 (A) | 12/2003 |
| 6,876,074 B1 | 4/2005 | Kim | | JP | 2003/347503 (A) | 12/2003 |
| 6,884,653 B1 | 4/2005 | Larson | | WO | WO 03/037053 A1 | 5/2003 |
| 6,891,729 B1 | 5/2005 | Ko et al. | | | | |
| 6,908,792 B1 | 6/2005 | Bruce et al. | | OTHER PUBLICATIONS | | |
| 6,914,324 B1 | 7/2005 | Rapport et al. | | | | |
| 6,919,626 B1 | 7/2005 | Burns | | | | |
| 2001/0006252 A1 | 7/2001 | Kim et al. | | | | |
| 2001/0013423 A1 | 8/2001 | Dalal et al. | | | | |
| 2001/0015487 A1 | 8/2001 | Forthun | | | | |
| 2001/0035572 A1 | 11/2001 | Isaak | | | | |
| 2001/0040793 A1* | 11/2001 | Inaba ......................... 361/749 | | | | |
| 2002/0006032 A1 | 1/2002 | Karabatsos | | | | |
| 2002/0027441 A1* | 3/2002 | Akram et al. ............... 324/754 | | | | |
| 2002/0030995 A1 | 3/2002 | Shoji | | | | |
| 2002/0048849 A1 | 4/2002 | Isaak | | | | |
| 2002/0076919 A1 | 6/2002 | Peters et al. | | | | |

William R. Newberry, Design Techniques for Ball Grid Arrays, Xynetix Design Systems, Inc., Portland, Maine, Published on the Internet.

Tessera Technologies, Inc.—Semiconductor Intellectual Property, Chip Sale Packaging—Website pages (3), Published on the Internet.

Tessera Introduces uZ ä—Ball Stacked Memory Package for Computing and Portable Electronic Products, Oyce Smaragdis, Tessera Public Relations, Sandy Skees, MCA PR (www. tessera.com/news_events/press_coverage.cfm); 2 figures that purport to be directed to the uZ ä—Ball Stacked Memory Package. Published Jul. 17, 2002, San Jose, CA.

Ron Bauer, Intel. "Stacked-CSP Delivers Flexibility, Reliability, and Space-Saving Capabilities", Spring 2002, Published on the Internet.
Tessra uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Website 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Flexible Printed Circuit Technology—A Versatile Interconnection Option. (Website 2 pages) Fjelstad, Joseph. Dec. 3, 2002.
Chip Scale Packaging and Redistribution, Paul A. Magill, Glenn A. Rinne, J. Daniels Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512KX 16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
1992 Proceedings, 42nd Electronic Components & Technology Conference, May 18-20, 1992.
Research Disclosure, Organic Card Device Carrier, 31318, May 1990, No. 313.
IBM Technical Disclosure Bulletin, vol. 23, No. 12, May 1981.
IBM Technical Disclosure Bulletin, vol. 20, No. 11A, Apr. 1978.
IBM Technical Disclosure Bulletin, vol. 32, No. 3B, Aug. 1989.
Orthogonal Chip Mount—A 3D Hybrid Wafer Scale Integration Technology, International Electron Device Meeting, IEDM Technical Digest, Washington, D.C., Dec. 6-9, 1987.

\* cited by examiner

*Primary Examiner*—Zandra V. Smith
*Assistant Examiner*—Thanh Y. Tran
(74) *Attorney, Agent, or Firm*—Andrew Kurth LLP; J. Scott Denko

(57) ABSTRACT

The present invention stacks chip scale-packaged integrated circuits (CSPs) into low profile modules that conserve PWB or other board surface area. Low profile structures provide connection between CSPs of the stacked module and between and to the flex circuitry. Low profile contacts are created by any of a variety of methods and materials including, for example, screen paste techniques and use of high temperature solders, although other application techniques and traditional solders may be employed for creating low profile contacts in the present invention. A consolidated low profile contact structure and technique is provided for use in alternative embodiments of the present invention. The CSPs employed in stacked modules devised in accordance with the present invention are connected with flex circuitry. That flex circuitry may exhibit one or two or more conductive layers. In some preferred embodiments, a form standard provides a physical form that allows many of the varying package sizes found in the broad family of CSP packages to be used to advantage while employing a standard connective flex circuitry design. In other embodiments, a heat spreader is disposed between the CSP and the flex circuitry thus providing an improved heat transference function without the standardization of the form standard, while still other embodiments lack either a form standard or a heat spreader and may employ, for example, the flex circuitry as a heat transference material.

6 Claims, 11 Drawing Sheets

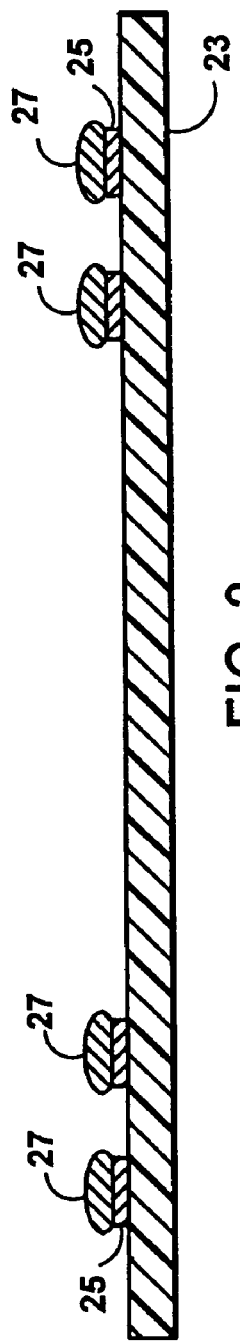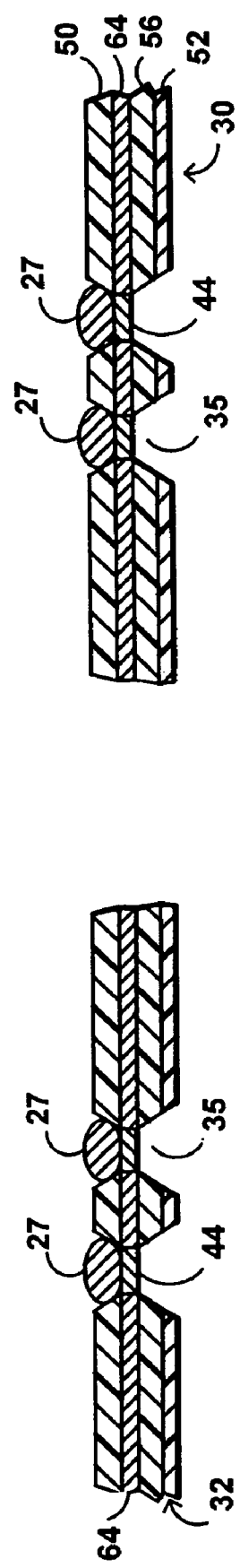

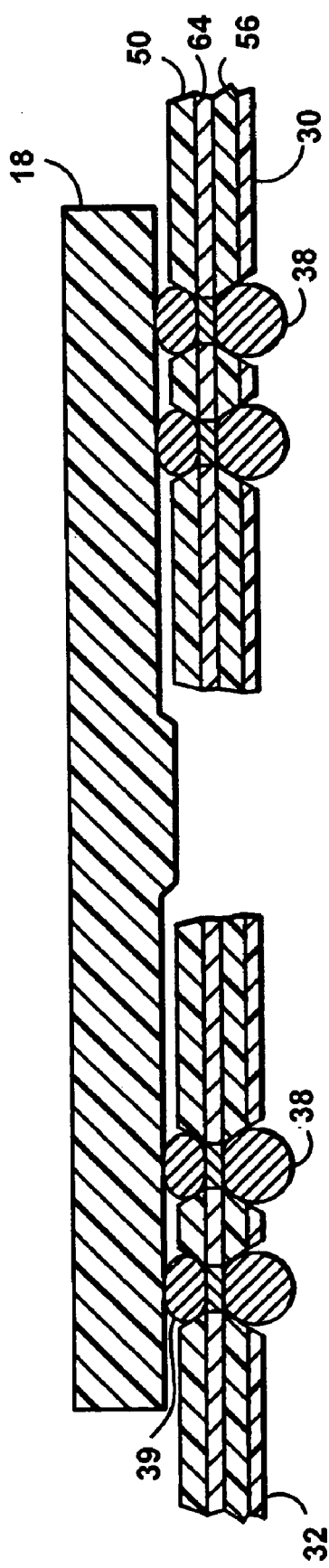
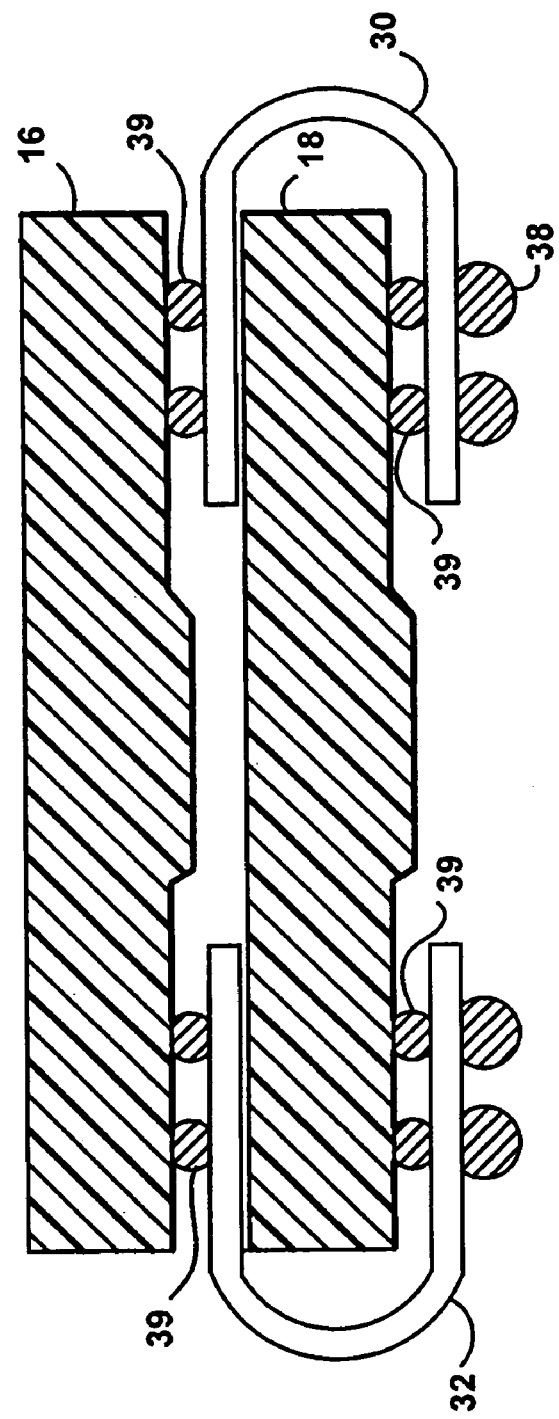

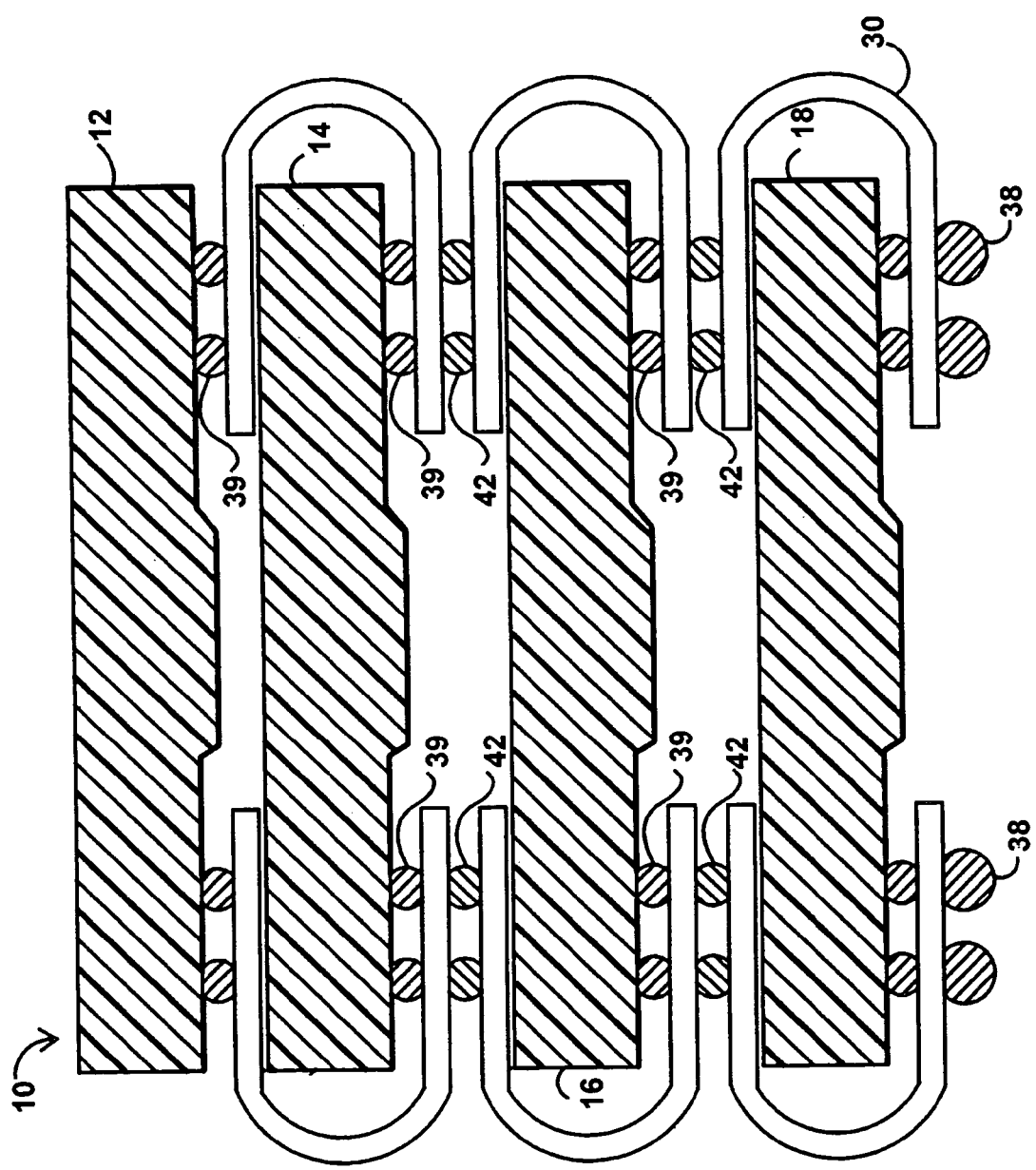

LOW PROFILE CHIP SCALE STACKING SYSTEM AND METHOD

RELATED APPLICATIONS

This application is a continuation of U.S. patent application Ser. No. 10/631,886, filed Jul. 11, 2003, now U.S. Pat No. 7,026,708, which is a continuation-in-part of U.S. patent application Ser. No. 10/453,398, filed Jun. 3, 2003, now U.S. Pat. No. 6,914,324, which is a continuation-in-part of U.S. patent application Ser. No. 10/005,581, filed Oct. 26, 2001, now U.S. Pat. No. 6,576,992 B2, issued Jun. 10, 2003. U.S. patent application Ser. No. 10/631,886 is also a continuation-in-part of U.S. patent application Ser. No. 10/457,608 filed Jun. 9, 2003, pending, and which application is a continuation-in-part of U.S. patent application Ser. No. 10/005,581, filed Oct. 26, 2001, now U.S. patent application Ser. No. 6,576,992 B2.

This application is also a continuation of U.S. patent application Ser. No. 10/457,608 filed Jun. 9, 2003, and which application is a continuation-in-part of U.S. patent application Ser. No. 10/005,581, filed Oct. 26, 2001, now U.S. patent application Ser. No. 6,576,992 B2.

TECHNICAL FIELD

The present invention relates to aggregating integrated circuits and, in particular, to stacking integrated circuits in chip-scale packages and mounting such devices on substrates.

BACKGROUND OF THE INVENTION

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or "CSP" have recently gained market share.

CSP refers generally to packages that provide connection to an integrated circuit through a set of contacts arrayed across a major surface of the package. Instead of leads emergent from a peripheral side of the package, contacts are placed on a major surface and typically are located along the planar bottom surface of the package. The absence of "leads" on package sides renders most stacking techniques devised for leaded packages inapplicable for CSP stacking. Not only is peripheral dimension an important consideration, but so too is profile height, particularly when CSPs are stacked. Additionally, methods to provide reliable strategies for mounting stacked devices are valuable in stacking.

What is needed, therefore, is a technique and system for stacking CSPs that provides a thermally efficient, reliable structure that performs well at higher frequencies but does not add excessive height to the stack yet allows production at reasonable cost with readily understood and managed materials and methods.

SUMMARY OF THE INVENTION

Provided is a system and method that mounts integrated circuit devices onto substrates and a system and method for employing the method in stacked modules. The contact pads of a packaged integrated circuit device are substantially exposed. A solder paste that includes higher temperature solder paste alloy is applied to a substrate or the contacts of the packaged device. The integrated circuit device is positioned to contact the contacts of the substrate with the higher temperature solder alloy paste between. Heat is applied to create high temperature joints between the contacts of the substrate and the integrated circuit device resulting in a device-substrate assembly with high temperature joints. The formed joints are less subject to re-melting in subsequent processing steps. The method may be employed in devising stacked module constructions such as those disclosed herein as preferred embodiments. Typically, the created joints are low in profile. In a method in accordance with the present invention, a first solder used to construct a stacked module has a higher melting point than a second solder used to populate a board with that module.

Preferred embodiments may also employ low profile contact structures to provide connection between CSPs of the stacked module and between and to the flex circuitry. Low profile contacts are created by any of a variety of methods and materials including, for example, screen paste techniques and use of high temperature solders, although other application techniques and traditional solders may be employed for creating low profile contacts that may be employed. A consolidated low profile contact structure and technique is provided for use in alternative embodiments.

Multiple numbers of CSPs may be stacked in accordance with the present invention. The CSPs employed in stacked modules devised in accordance with the present invention are connected with flex circuitry. That flex circuitry may exhibit one or two or more conductive layers with preferred embodiments having two conductive layers. In some preferred embodiments, a form standard provides a physical form that allows many of the varying package sizes found in the broad family of CSP packages to be used to advantage while employing a standard connective flex circuitry design. In other embodiments, a heat spreader is disposed between the CSP and the flex circuitry thus providing an improved heat transference function without the standardization of the form standard, while still other embodiments lack either a form standard or a heat spreader and may employ, for example, the flex circuitry as a heat transference material.

BRIEF DESCRIPTION OF THE DRAWINGS

FIG. 3 depicts a set of substrate contacts upon which a high temperature solder paste has been applied in accordance with a preferred embodiment of the present invention.

FIG. 4 depicts portions of two flexible circuit connectors prepared for mounting of an integrated circuit device in accordance with a preferred embodiment of the present invention.

FIG. 5 depicts a device-substrate assembly in accordance with a preferred embodiment of the present invention.

FIG. 6 depicts a two-high integrated circuit module mounted to the two flexible circuit connectors depicted in FIG. 4 in accordance with a preferred embodiment of the present invention.

FIG. 7 depicts a four-high stacked module devised in accordance with a preferred embodiment of the present invention.

DESCRIPTION OF PREFERRED EMBODIMENTS

The methods and systems disclosed herein are used with CSP packages of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term CSP should be broadly considered in the context of this application. The methods and systems disclosed may be employed to advantage in the wide range of CSP configurations available in the art where an array of connective elements is available from at least one major surface. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of the FIGS. are depicted with CSPs of a particular profile known to those in the art, but it should be understood that the figures are exemplary only. The invention is advantageously employed with CSPs that contain memory circuits, but may be employed to advantage with logic and computing circuits where added capacity without commensurate PWB or other board surface area consumption is desired.

Figure 1:
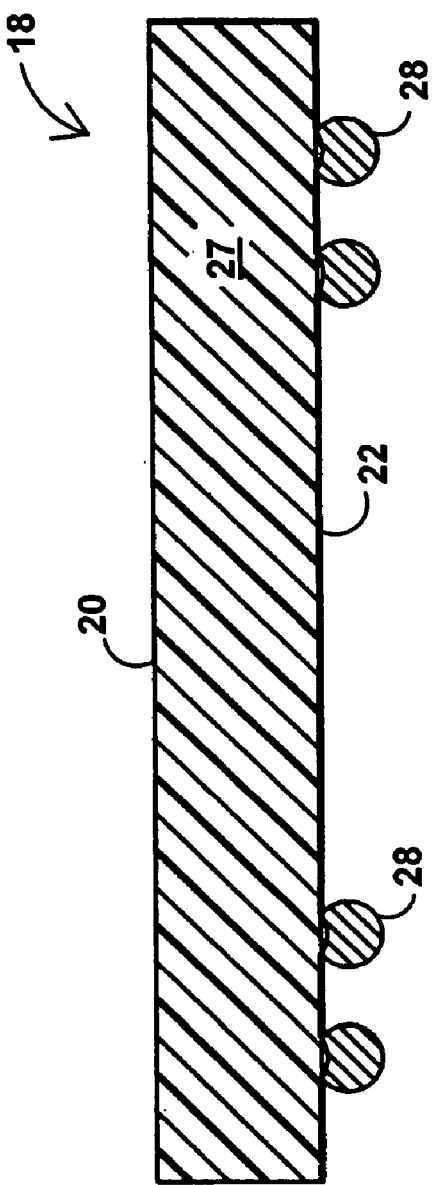
FIG. 1 depicts a typical prior art packaged integrated circuit device.

FIG. 1 depicts an exemplar integrated circuit device 18 having upper surface 20 and lower surface 22. Device 18 is an example of one type of the general class of devices commonly known in the art as chip-scale-packaged integrated circuits ("CSPs"). The present invention may employed with a wide variety of integrated circuit devices and is not, as those of skill in the art will understand, limited to devices having the profile depicted in FIG. 1. Further, although its preferred use is with plastic-bodied CSP devices, the invention provides advantages in mounting a variety of packaged integrated circuit devices in a wide variety of configurations including leaded and CSP topologies.

Exemplar integrated circuit device (CSP) 18 may include one or more integrated circuit die and body 27 and a set of contacts 28. The illustrated CSP 18 has CSP ball contacts 28 arrayed along surface 22 of its body 27. Typically, in CSP 18, CSP ball contacts 28 are, as depicted, balls that are a mixture of tin and lead with a common relative composition of 63% tin and 37% lead. Such contacts typically have a melting point of about 183° C. Other contacts are sometimes found along a planar surface of integrated circuit devices and such other contacts may also be treated in accordance with the present invention where the opportunity arises as will be understood after gaining familiarity with the present disclosure.

Figure 2:
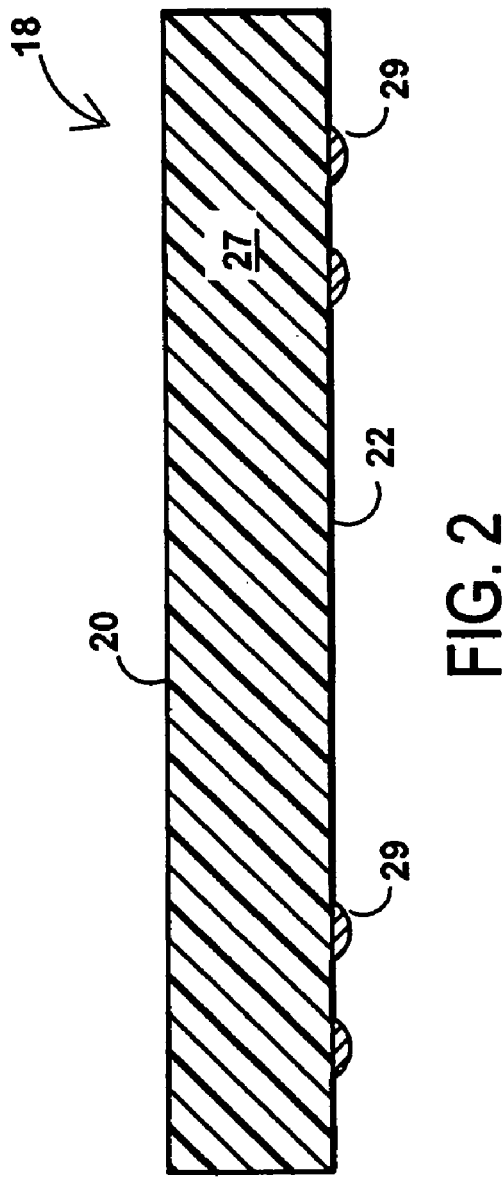
FIG. 2 depicts the device of FIG. 1 from which the solder ball contacts have been removed.

In the depiction of FIG. 2, CSP ball contacts 28 have been removed, leaving CSP pads 29 arrayed along lower surface 22. CSP pads 29 will typically exhibit a residual thin layer of tin/lead mixture after removal of CSP ball contacts 28. As those of skill will know, CSPs may be received without attached balls and the process and structures described herein will then not require "removal" of balls. Further, embodiments of the present invention may be implemented with CSPs already bearing ball contacts comprised of high temperature solders.

FIG. 3 depicts exemplar substrate 23 on which are disposed contacts 25. Substrate 23 is depicted as a rigid board such as a PWB or PCB such as are known in the art. In accordance with a preferred embodiment of the present invention, a solder paste 27 is applied to substrate contacts 25. In accordance with an alternative preferred embodiment of the invention, solder paste 27 is applied to the CSP pads 29 and not the substrate contacts 25. However, as those of skill will recognize, solder paste 27 may applied to both or either substrate contacts 25 and CSP pads 29 (or a set of contacts of other configuration when devices that are not CSP are used in accordance with the invention.) As those of skill understand, solder paste is a mixture of solder particles and flux.

Two or more of the elements lead, tin, silver, copper, antimony or indium may be employed in a variety of combinations to devise a solder to be employed in solder paste 27 in accordance with the present invention. Therefore, in accordance with preferred embodiments of the present invention, a solder alloy employed in solder paste 27 exhibits a melting point equal to or greater than 235° C. and, preferably between 235° C. and 312° C. The alloy chosen should not have a melting point so high that the IC package is adversely affected, but it should also not be so low as to remelt during board assembly operations.

Some market participants are starting to implement lead-free solders. Such lead-free solders will typically have melting points higher than those found in lead inclusive solders. Typically, those who use lead-free solders to populate boards with stacked modules will, for example, employ temperatures up to 240° C. in the process of attachment of stacked modules to boards. Consequently, a HT joint implemented with a lead-free alloy will, in conformity with preferred embodiments of the present invention, exhibit a melting point greater than those lead-free solders used to populate boards. Consequently, a preferred implementation of the HT joints of the present invention will have a melting point range of between 245° C. and 265° C. The lead-free solder alloy employed in such HT joints will be comprised of at least two of the following elements: tin, silver, copper, or indium.

Preferably, an alloy used as a solder in the present invention will melt over a narrow temperature range. Disintegration of the module during board attachment or population will be less likely if the melt range is narrow. Most preferably, the top of the melting point range of the solder used in board attachment should be exceeded by 15° C. by the melting point of the solder used to manufacture the stacked module although in the case of lead-free solders, this is reduced to ameliorate issues that could arise from exposure of the package to high temperatures.

The following combinations have been found to exhibit the following melting points, and the below recited combinations are merely a representative, but not exhaustive, list of examples of solder alloys appropriate for use in the present invention. As those of skill will recognize, these examples are instructive in selecting other preferred particular combinations of lead, tin, silver, copper, antimony, and indium that are readily employed to advantage in the present invention so as to arrive at alloys of at least two of the following solder elements: lead, tin, silver, copper, antimony, and indium that have in their combined mixture, a preferred melting point between 235° C. to 312° C. inclusive.

A combination of 95% Sn and 5% Sb melts over a range of 235° C. to 240° C.

A combination of 83% Pb and 10% Sb and 5% Sn and 2% Ag melts over a range of 237° C. to 247° C.

A combination of 85% Pb and 10% Sb and 5% Sn melts over a range of 245° C. to 255° C.

A combination of 90% Pb and 10% Sb melts over a range of 252° C. to 260° C.

A combination of 92.5% Pb, 5% Sn and 2.5% Ag melts over a range of 287° C. to 296° C.

A combination of 90% Pb and 10% Sn melts over a range of 275° C. to 302° C.

A combination of 95% Pb and 5% Sn melts over a range of 308° C. to 312° C.

A combination of 75% Pb and 25% Indium melts over a range of 240° C. to 260° C.

Those of skill will note that solder alloys or mixtures may also be employed in embodiments of the present invention that exhibit melting points lower than 235° C., as would be exhibited for example with a 97% Sn and a 3% Sb alloy, but preferred embodiments will employ solder mixtures or alloys that melt between 235° C. and 312° C. inclusive.

FIG. 4 depicts portions of flex circuitry comprised of two flexible circuit connectors 30 and 32 prepared for mounting of a device 10 in accordance with a preferred embodiment of the present invention. Exemplar flex circuits 30 and 32 may be simple flex circuitry or may exhibit the more sophisticated designs of flex circuitry such as those that are later described herein. For clarity of exposition, depicted flex circuits 30 and 32 exhibit a single conductive layer 64 and a first outer layer 50. Conductive layer 64 is supported by substrate layer 56, which, in a preferred embodiment, is a polyimide. Outer layer 52 resides along the lower surface of the flex circuits 30 and 32. Optional outer layers 50 and 52, when present, are typically a covercoat or solder mask material. Windows 35 are created through outer layer 52 and intermediate layer 56 to expose flex contacts 44.

As depicted in FIG. 4, solder paste 27 is applied to flex contacts 36 which are demarked at the level of conductive layer 64. Solder paste 27 may also alternatively or in addition, be applied to the CSP pads 29 of a CSP. Windows 35 provide openings through which module contacts may be disposed in a later stacked module assembly step. Those of skill will recognize that the method of the present invention is applicable to a wide variety of substrates including solid PWB's, rigid flex, and flexible substrates such as flexible circuits, for example, and the substrate employed can be prepared in accordance with the present invention in a manner appropriate for the intended application. Where the invention is employed with rigid substrates such as a PWB, multilayer strategies and windowing in substrate layers are techniques which are useful in conjunction with the present invention, but not essential.

FIG. 5 depicts a device-substrate assembly in accordance with a preferred embodiment of the present invention as may be employed in the construction of a low profile stacked module. The features depicted in FIG. 5 are not drawn to scale, and show various features in an enlarged aspect for purposes of illustration. As shown, CSP 18 is disposed upon flex circuits 30 and 32 which have been, in a preferred embodiment of the method of the present invention, previously prepared as shown in earlier FIG. 4. Module contacts 38 have been appended to flex circuits 30 and 32 to provide connective facility for the device-flex combination whether as part of a stacked module or otherwise.

High temperature joint contacts 39 ("HT joints") are formed by the melting of the lead alloy in previously applied solder paste 27 and the application of a selected heat range appropriate for the solder mixtures identified previously. Thus, HT joints 39 will, after solidification, typically not re-melt unless exposed subsequently to such temperature ranges. The temperature range applied in this step of assembly will not typically be subsequently encountered in a later assembly operation such as, for example, the application of a stacked module to a DIMM board. Consequently, in one embodiment, the present invention is articulated as a stacked module having HT joints that is appended to a DIMM board with traditional lower melting point solder.

FIG. 6 depicts a two-high stacked module devised in accordance with a preferred embodiment of the present invention. Stacked module 10 shown in FIG. 6 includes lower CSP 18 and upper CSP 16. A stacked module 10 may be devised in accordance with the present invention that includes more than two CSPs. Flex circuits 30 and 32 are depicted connecting lower CSP 18 and upper CSP 16. Those of skill will also recognize that module 10 may be implemented with a single flexible circuit connector. Further, the flexible circuit connectors employed in accordance with the invention may exhibit one or more conductive layers. Flex circuits 30 and 32 may be any circuit connector structure that provides connective facility between two integrated circuits having a contact array. Those of skill will note that flexible circuits 30 and 32 may exhibit single conductive layers (such as, for example, the flexible circuit connectors earlier illustrated herein in FIG. 5) or may exhibit multiple conductive layers such as those shown in the present figures, for example. Those of skill will readily appreciate how a variety of circuit structures may be employed in preferred embodiments. Further, the connective structures used to connect lower integrated circuit 18 with upper integrated circuit 16 need not literally be flexible circuit connectors but may be flexible in portions and rigid in other portions.

HT contacts 39 are employed in the preferred embodiment of FIG. 6 to provide connective facility between the respective integrated circuits and contacts borne by the flex circuits 30 and 32. Preferably, HT joints 39 will exhibit a height dimension smaller than that of CSP ball contacts 28 shown earlier as part of typical CSPs in FIG. 1. As those of skill will recognize, HT joints 39 are depicted in a scale that is enlarged relative to joint sizes that would typically be encountered in actual practice of preferred modes of the invention. Thus, module 10 will preferably present a lower profile than stacked modules created employing typical CSP contacts 28 on each of the constituent integrated circuit packages employed in a stacked module 10.

FIG. 7 depicts module 10 as lower (or level one) CSP 18, upper (or level two) CSP 16, $3^{rd}$ (or level three) CSP 14, and $4^{th}$ (or level four) CSP 12. When the present invention is employed between flex circuits in stacking multiple levels of CSPs, as for example in FIG. 7, some embodiments will present HT contacts that have minimal heights that do not cause appreciable separation between the flex circuitry associated with CSP 52 and CSP 54, for example, or between CSP 54 and CSP 58, for example. For such embodiments, the apparent height for illustrated HT joints 39, particularly, that lie between respective layers of flex circuitry will be understood to be exaggerated in the depiction of FIG. 7. Three sets of flex circuitry pairs 30 and 32 are also shown but, as in other embodiments, the invention may be implemented with a variety of substrates including single flex circuits in place of the depicted pair and with flexible circuits that have one or plural conductive layers.

As shown, the HT joints provide connections between integrated circuit devices and substrates and the overall profile of module 10 is reduced by use of the present invention that provides advantages in subsequent processing steps such as, for example, affixation of module 10 to DIMM boards, for example.

To construct a stacked module in accordance with a preferred embodiment of the present invention, if present, ball contacts 28 are removed from a CSP leaving CSP contacts 29 that typically exhibit a residual layer of solder. A high temperature solder paste composed from a lead alloy or mixture that has a preferable melting point equal to or higher than 235° C. and preferably less than 312° C. is applied to substrate contacts 25 of a substrate such as a flexible circuit and/or the substrate contacts to which it is to be mounted. The CSP is positioned to place the CSP pads 29 and substrate contacts 25 in appropriate proximity. Heat is applied sufficient to melt the lead solder alloy of solder paste 27 thus forming HT joints 39. The flexible circuit is positioned to place portions of the flexible circuit connector between the first CSP and a second CSP that is connected to the substrate with HT joints created using the process described for creating HT joints.

In understanding the present invention, it may be helpful to articulate the relative melting points in terms of variables to illustrate the relationships between the HT joints used to construct a stacked module and the solders used to populate a board with such a HT joint-implemented stacked module. In use in board population, the present invention will provide a stacked high module that is assembled using the HT joints that exhibit melting point ranges between X and Y degrees where X is less than Y. Attachment of the stacked module to a board is then implemented with a solder having a melting point between A and B degrees where A and B are less than X.

Figure 8:
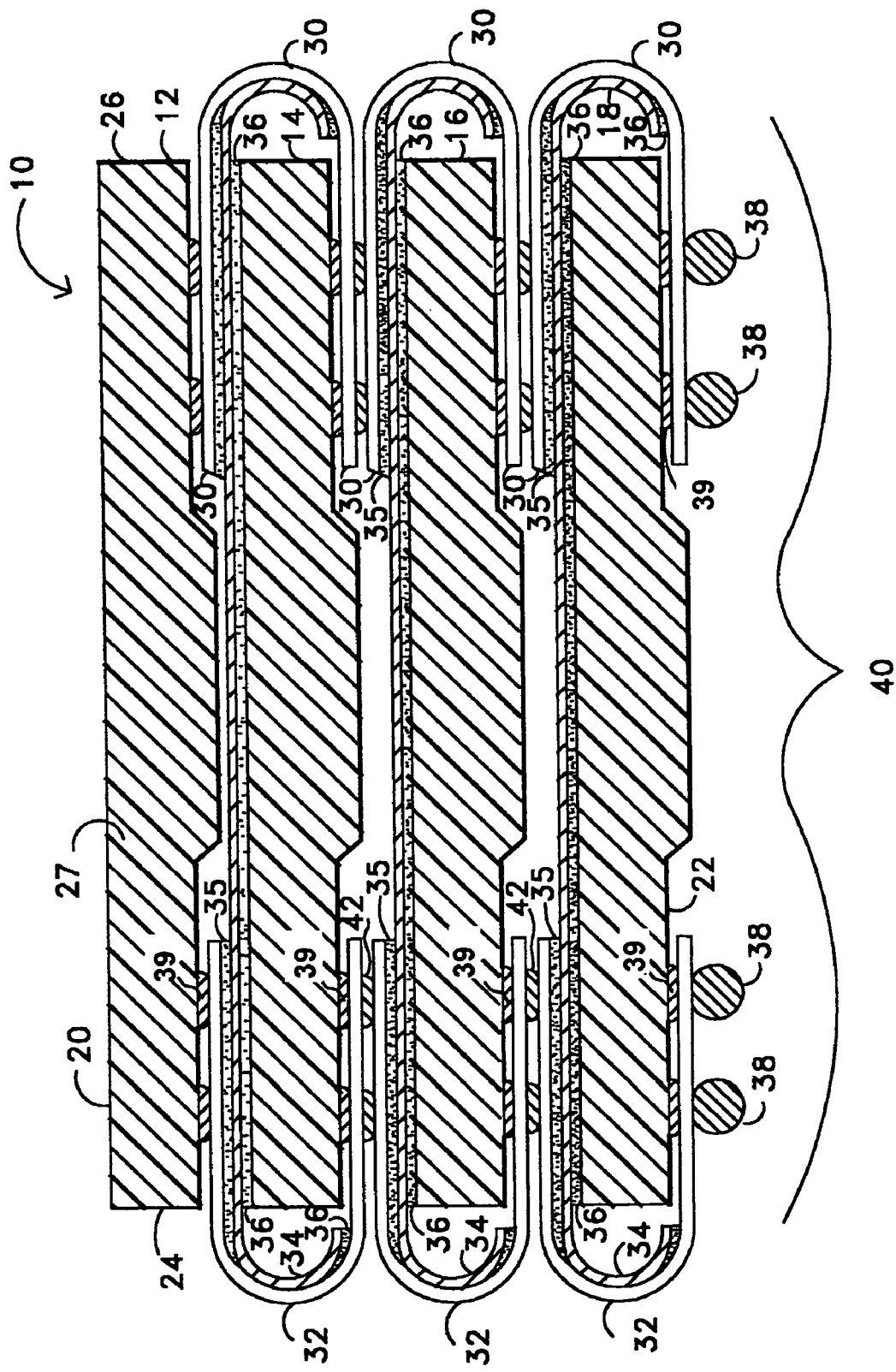
FIG. 8 is an elevation view of a high-density circuit module devised in accordance with a preferred four-high embodiment of the present invention.

FIG. 8 is an elevation view of module 10 devised in accordance with a preferred embodiment of the present invention. Exemplar module 10 is comprised of four CSPs: level four CSP 12, level three CSP 14, level two CSP 16, and level one CSP 18. Each of the depicted CSPs has an upper surface 20 and a lower surface 22 and opposite lateral sides or edges 24 and 26 and include at least one integrated circuit surrounded by a body 27.

Shown in FIG. 8 are low profile contacts 28 along lower surfaces 22 of the illustrated constituent CSPs 12, 14, 16, and 18. Low profile contacts 28 provide connection to the integrated circuit or circuits within the respective packages.

CSPs often exhibit an array of balls along lower surface 22. Such ball contacts are typically solder ball-like structures appended to contact pads arrayed along lower surface 22. In many preferred embodiments of the present invention, CSPs that exhibit balls along lower surface 22 are processed to strip the balls from lower surface 22 or, alternatively, CSPs that do not have ball contacts or other contacts of appreciable height are employed. Only as a further example of the variety of contacts that may be employed in alternative preferred embodiments of the present invention, an embodiment is later disclosed in FIG. 11 and the accompanying text that is constructed using a CSP that exhibits ball contacts along lower surface 22. The ball contacts are then reflowed to create what will be called a consolidated contact.

Embodiments of the invention may also be devised that employ both standard ball contacts and low profile contacts or consolidated contacts. For example, in the place of low profile inter-flex contacts 42 or, in the place of low profile contacts 28, or in various combinations of those structures, standard ball contacts may be employed at some levels of module 10, while low profile contacts and/or low profile inter-flex contacts or consolidated contacts are used at other levels.

A typical eutectic ball found on a typical CSP memory device is approximately 15 mils in height. After solder reflow, such a ball contact will typically have a height of about 10 mils. In preferred modes of the present invention, low profile contacts 28 and/or low profile inter-flex contacts 42 have a height of approximately 7 mils or less and, more preferably, less than 5 mils.

Where present, the contact sites of a CSP that are typically found under or within the ball contacts typically provided on a CSP, participate in the creation of low profile contacts 28. One set of methods by which high-temperature types of low profile contacts 28 suitable for use in embodiments of the present invention have been disclosed herein. In other embodiments, more typical solders, in paste form for example, may be applied either to the exposed contact sites or pads along lower surface 22 of a CSP and/or to the appropriate flex contact sites of the designated flex circuit to be employed with that CSP.

In FIG. 8, iterations of flex circuits ("flex", "flex circuits," "flexible circuit structures," "flexible circuitry") 30 and 32 are shown connecting various constituent CSPs. Any flexible or conformable substrate with an internal layer connectivity capability may be used as a preferable flex circuit in the invention. The entire flex circuit may be flexible or, as those of skill in the art will recognize, a PCB structure made flexible in certain areas to allow conformability around CSPs and rigid in other areas for planarity along CSP surfaces may be employed as an alternative flex circuit in the present invention. For example, structures known as rigid-flex may be employed.

Form standard 34 is shown disposed adjacent to upper surface 20 of each of the CSPs below level four CSP 12. Form standard 34 may be fixed to upper surface 20 of the respective CSP with an adhesive 36 which preferably is thermally conductive. Form standard 34 may also, in alternative embodiments, merely lay on upper surface 20 or be separated from upper surface 20 by an air gap or medium such as a thermal slug or non-thermal layer.

Figure 14:
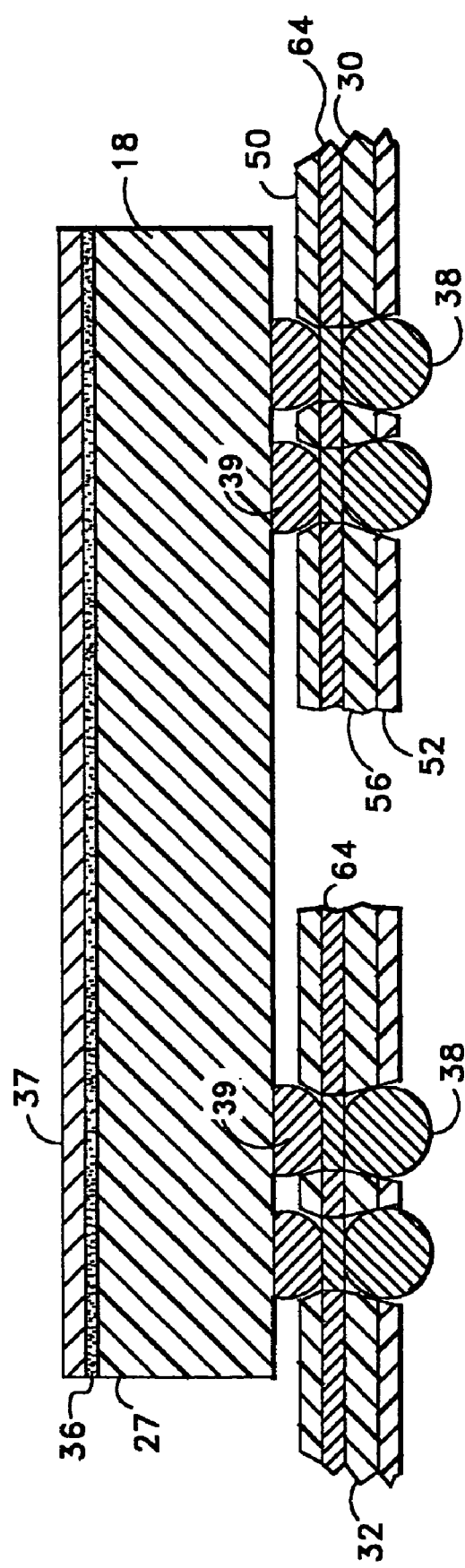
FIG. 14 is an elevation view of a portion of an alternative construction step in an alternative embodiment of the present invention.

In other embodiments, a heat spreader may act as a heat transference media and reside between the flex circuitry and the package body 27 or may be used in place of form standard 34. Such a heat spreader is shown in FIG. 14 as an example and is identified by reference numeral 37. In still other embodiments, there will be no heat spreader 37 or form standard 34 and the embodiment may use the flex circuitry as a heat transference material.

With continuing reference to FIG. 8, form standard 34 is, in a preferred embodiment, devised from copper to create, as shown in the depicted preferred embodiment of FIG. 8, a mandrel that mitigates thermal accumulation while providing a standard-sized form about which flex circuitry is disposed. Form standard 34 may take other shapes and forms such as, for example, an angular "cap" that rests upon the respective CSP body. Form standard 34 also need not be thermally enhancing although such attributes are preferable. The form standard 34 allows modules 10 to be devised with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 34 method and/or systems disclosed herein to create stacked modules from CSPs having different sized packages. This will allow the same flexible circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e. flex circuitry). In a preferred embodiment, form standard 34 will present a lateral extent broader than the upper major surface of the CSP over which it is disposed. Thus, the CSPs from one manufacturer may be aggregated into a stacked module 10 with the same flex circuitry used to aggregate CSPs from another manufacturer into a different stacked module 10 despite the CSPs from the two different manufacturers having different dimensions.

Further, as those of skill will recognize, mixed sizes of CSPs may be implemented into the same module 10, such as would be useful to implement embodiments of a system-on-a-stack.

Preferably, portions of flex circuits 30 and 32 are fixed to form standard 34 by adhesive 35 which is preferably a tape adhesive, but may be a liquid adhesive or may be placed in discrete locations across the package. Preferably, adhesive 35 is thermally conductive.

In a preferred embodiment, flex circuits 30 and 32 are multi-layer flexible circuit structures that have at least two conductive layers examples of which are described herein. Other embodiments may, however, employ flex circuitry, either as one circuit or two flex circuits to connect a pair of CSPs, that have only a single conductive layer, examples of which are also shown herein.

Preferably, the conductive layers employed in flex circuitry of module 10 are metal such as alloy 110. The use of plural conductive layers provides advantages and the creation of a distributed capacitance across module 10 intended to reduce noise or bounce effects that can, particularly at higher frequencies, degrade signal integrity, as those of skill in the art will recognize.

Module 10 of FIG. 8 has plural module contacts 38 collectively identified as module array 40. Connections between flex circuits are shown as being implemented with low profile inter-flex contacts 42 which are, in preferred embodiments, low profile contacts comprised of solder-combined with pads and/or rings such as the flex contacts 44 shown in FIG. 10 or flex contacts 44 with orifices as shown in FIG. 11 being just examples.

Form standard 34, as employed in one preferred embodiment, is approximately 5 mils in thickness, while flex circuits 30 and 32 are typically thinner than 5 mils. Thus, the depiction of FIG. 8 is not to scale.

Figure 9:
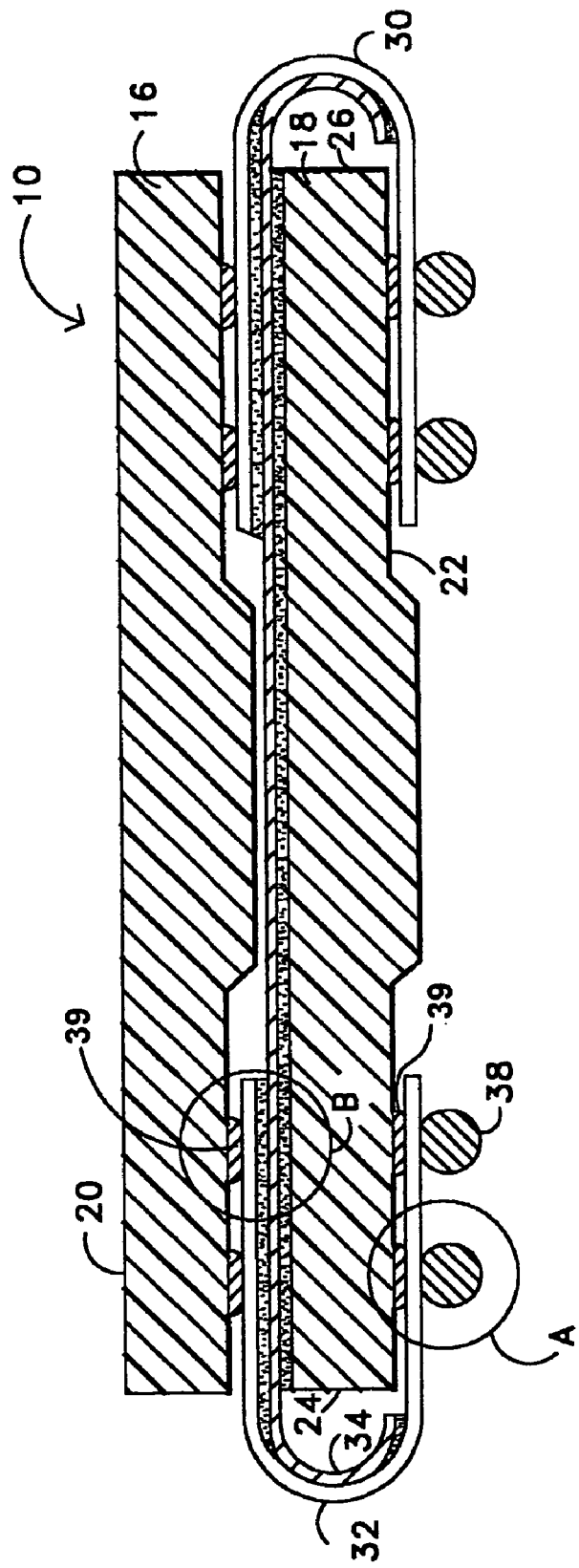
FIG. 9 is an elevation view of a stacked high-density circuit module devised in accordance with a preferred two-high embodiment of the present invention.
Figure 11:
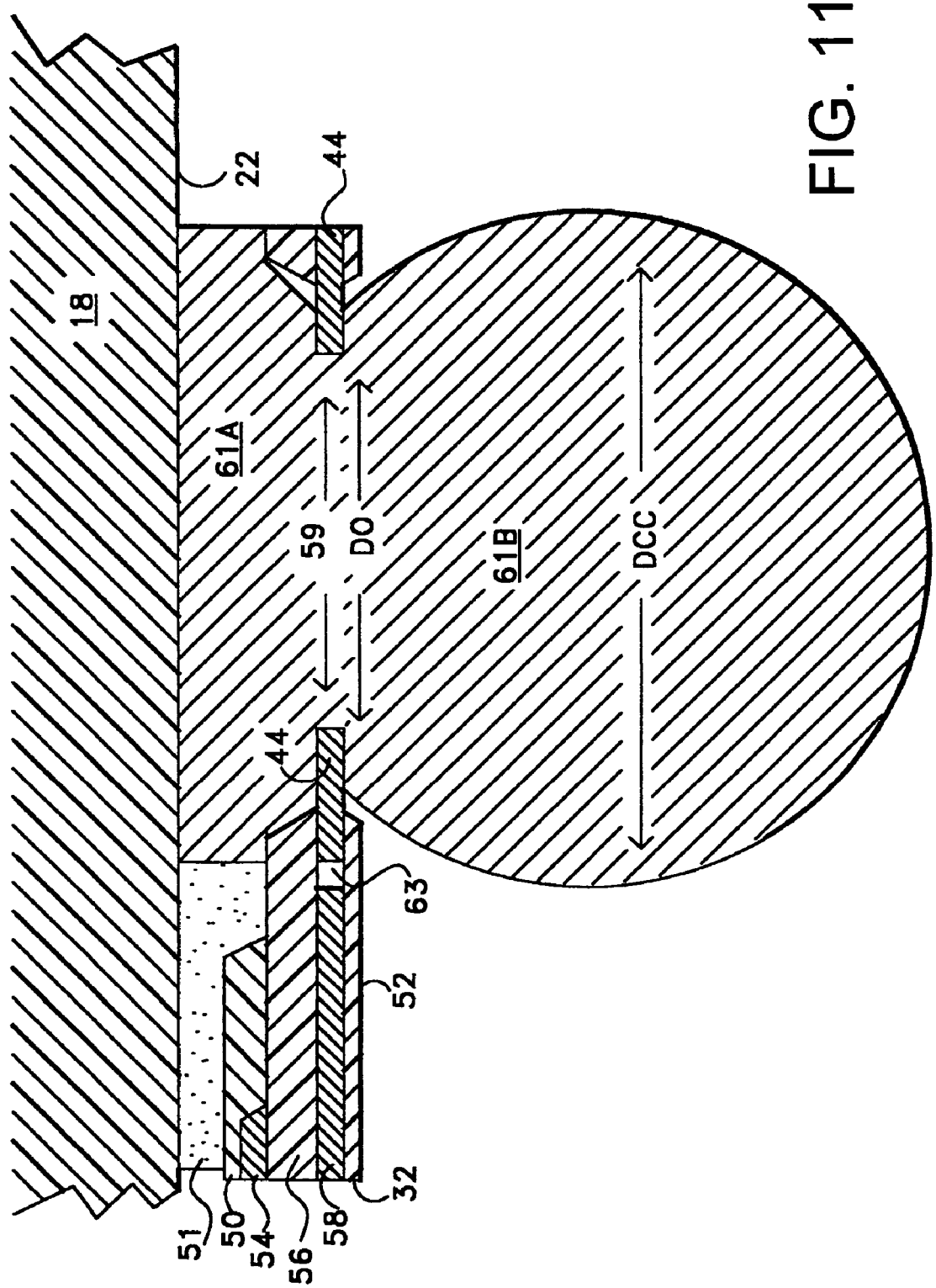
FIG. 11 depicts, in enlarged view, one alternative construction for of the area marked "A" in FIG. 9.
Figure 12:
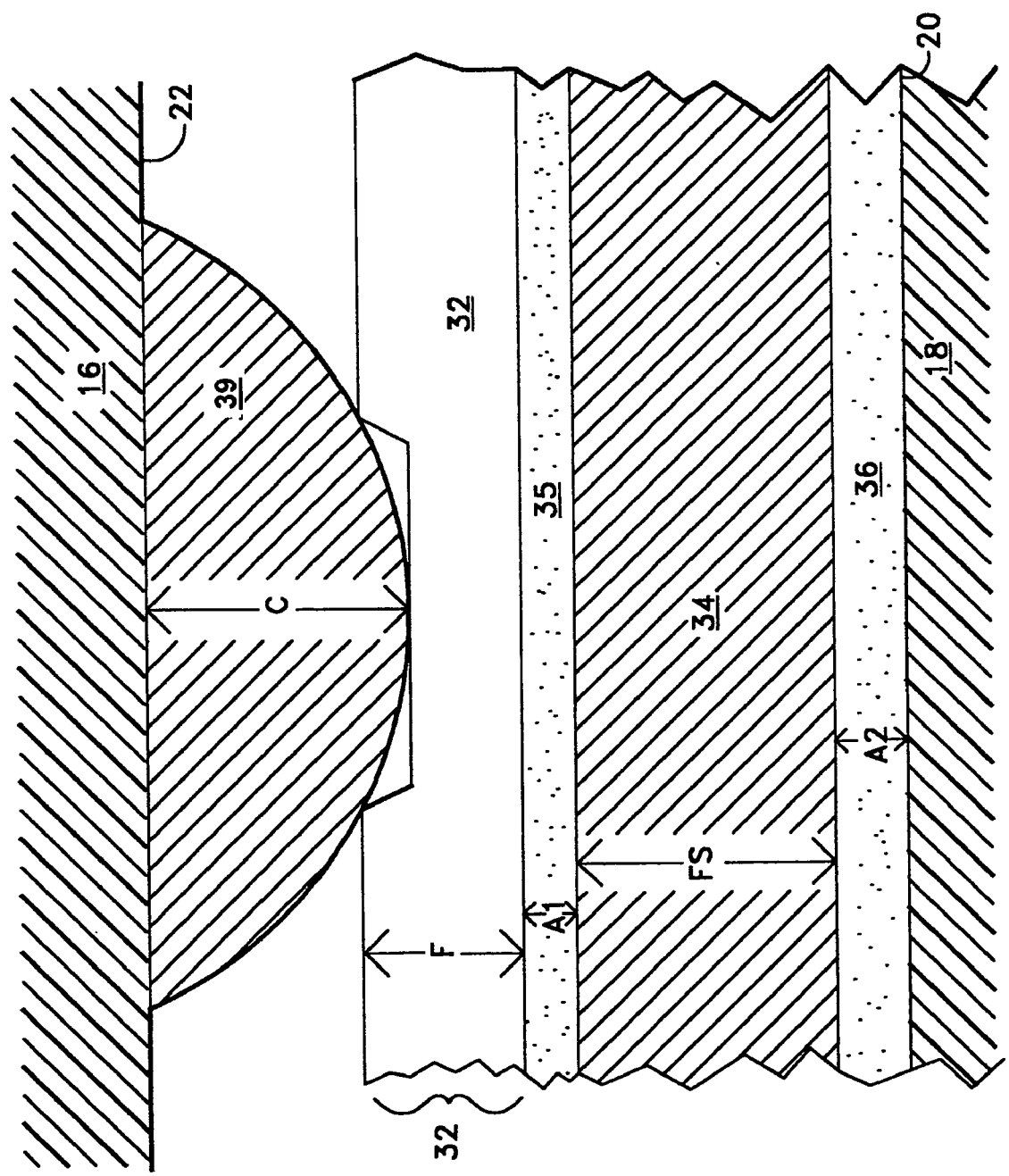
FIG. 12 depicts in enlarged view, the area marked "B" in FIG. 9 in a preferred embodiment of the present invention.

FIG. 9 illustrates an exemplar two-high module 10 devised in accordance with a preferred embodiment of the present invention. The depiction of FIG. 9 identifies two areas "A" and "B", respectively, that are shown in greater detail in later figures. In later FIGS. 10 and 11, there are shown details of two alternative embodiments for the area marked "A" in FIG. 9. It should be understood that many different connection alternatives are available and within the scope of the invention. FIG. 12 depicts details of the area marked "B" in FIG. 9.

Figure 10:
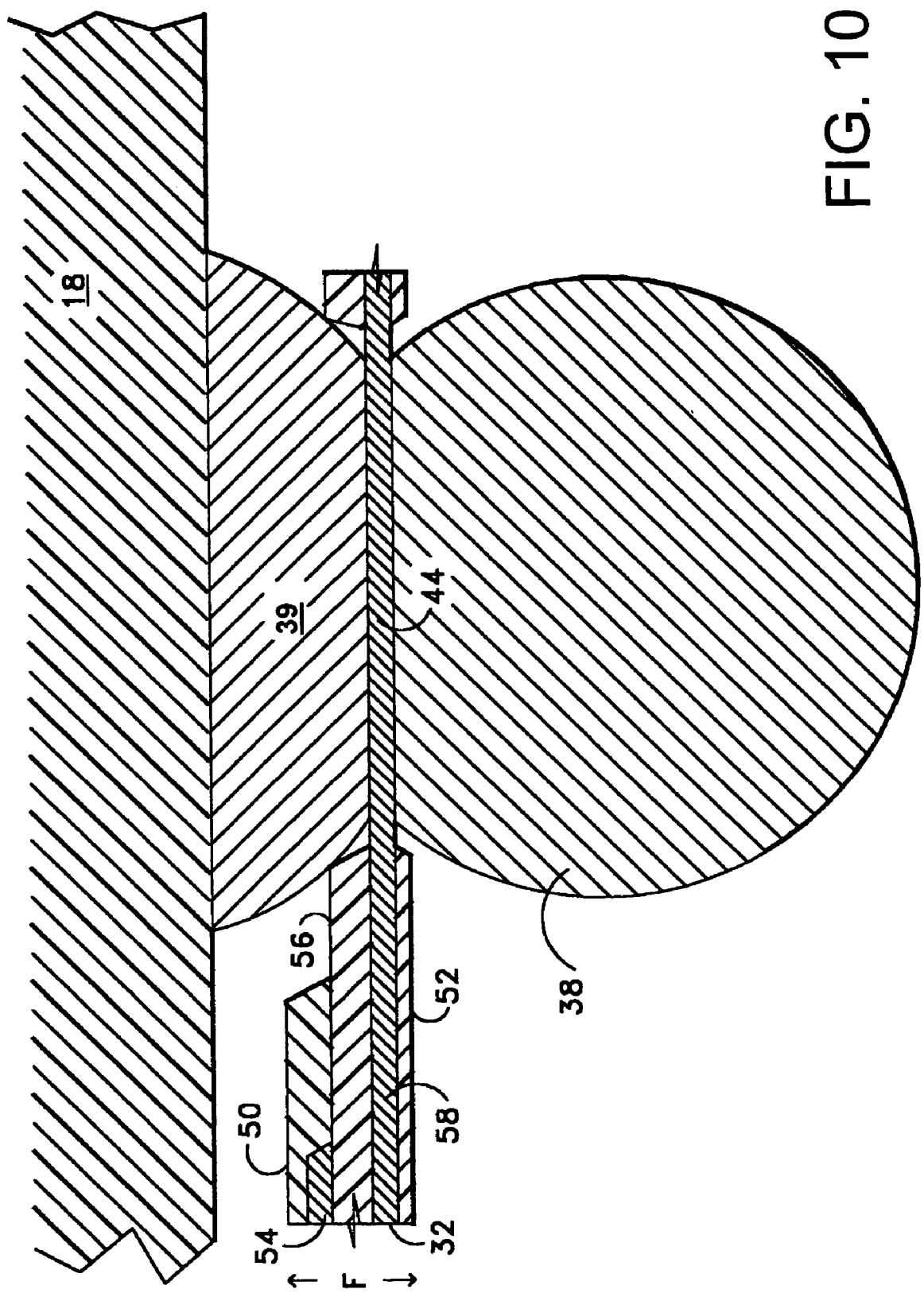
FIG. 10 depicts, in enlarged view, the area marked "A" in FIG. 9 in a preferred embodiment of the present invention.

FIG. 10 depicts, in enlarged view, one alternative for structures that may be used in the area marked "A" in FIG. 9. FIG. 10 depicts an example preferred connection between an example low profile contact 28 and module contact 38 through flex contact 44 of flex 32 to illustrate a solid metal path from level one CSP 18 to module contact 38 and, therefore, to an application PWB or memory expansion board to which module 10 is connectable.

Flex 32 is shown in FIG. 10 to be comprised of multiple conductive layers. This is merely an exemplar flexible circuitry that may be employed with the present invention. A single conductive layer and other variations on the flexible circuitry may, as those of skill will recognize, be employed to advantage in alternative embodiments of the present invention.

Flex 32 has a first outer surface 50 and a second outer surface 52. Preferred flex circuit 32 has at least two conductive layers interior to first and second outer surfaces 50 and 52. There may be more than two conductive layers in flex 30 and flex 32 and other types of flex circuitry may employ only one conductive layer. In the depicted preferred embodiment, first conductive layer 54 and second conductive layer 58 are interior to first and second outer surfaces 50 and 52. Intermediate layer 56 lies between first conductive layer 54 and second conductive layer 58. There may be more than one intermediate layer, but one intermediate layer of polyimide is preferred. The designation "F" as shown in FIG. 10 notes the thickness "F" of flex circuit 32 which, in preferred embodiment, is approximately 3 mils. Thinner flex circuits may be employed, particularly where only one conductive layer is employed, and flex circuits thicker than 3 mils may also be employed, with commensurate addition to the overall height of module 10.

As depicted in FIG. 10, an example flex contact 44 is comprised from metal at the level of second conductive layer 58 interior to second outer surface 52.

FIG. 11 depicts an alternative structure for the connection in the area marked "A" in FIG. 9. In the depiction of FIG. 11, a flex contact 44 is penetrated by orifice 59 which has a median opening of dimension "DO" indicated by the arrow in FIG. 11. Demarcation gap 63 is shown in FIG. 11. This gap may be employed to separate or demarcate flex contacts such as flex contact 44 from its respective conductive layer. Also shown in FIG. 11 is an optional adhesive or conformed material 51 between flex circuit 32 and CSP 18.

The consolidated contact 61 shown in FIG. 11 provides connection to CSP 18 and passes through orifice 59. Consolidated contact 61 may be understood to have two portions 61A that may be identified as an "inner" flex portion and, 61B that may be identified as an "outer" flex portion, the inner and outer flex portions of consolidated contact 61 being delineated by the orifice. The outer flex portion 61B of consolidated contact 61 has a median lateral extent identified in FIG. 11 as "DCC" which is greater than the median opening "DO" of orifice 59. The depicted consolidated contact 61 is preferably created in a preferred embodiment, by providing a CSP with ball contacts. Those ball contacts are placed adjacent to flex contacts 44 that have orifices 59. Heat sufficient to melt the ball contacts is applied. This causes the ball contacts to melt and reflow in part through the respective orifices 59 to create emergent from the orifices, outer flex portion 61B, leaving inner flex portion 61A nearer to lower surface 22 of CSP 18.

Thus, in the depicted embodiment, module 10 is constructed with a level one CSP 18 that exhibits balls as contacts, but those ball contacts are re-melted during the construction of module 10 to allow the solder constituting the ball to pass through orifice 59 of the respective flex contact 44 to create a consolidated contact 61 that serves to connect CSP 18 and flex circuitry 32, yet preserve a low profile aspect to module 10 while providing a contact for module 10. Those of skill will recognize that this alternative connection strategy may be employed with any one or more of the CSPs of module 10.

As those skilled will note, a consolidated contact 61 may be employed to take the place of a low profile contact 28 and module contact 38 in the alternative embodiments. Further, either alternatively, or in addition, a consolidated contact 61 may also be employed in the place of a low profile contact 28 and/or an inter-flex contact 42 in alternative embodiments where the conductive layer design of the flex circuitry will allow the penetration of the flex circuitry implicated by the strategy.

FIG. 12 depicts the area marked "B" in FIG. 9. The depiction of FIG. 12 includes approximations of certain dimensions of several elements in a preferred embodiment of module 10. It must be understood that these are just examples relevant to some preferred embodiments, and those of skill will immediately recognize that the invention may be implemented with variations on these dimensions and with and without all the elements shown in FIG. 12.

There are a variety of methods of creating low profile contacts 28. One method that is effective is the screen application of solder paste to the exposed CSP contact pad areas of the CSP and/or to the contact sites of the flex circuitry. For screened solder paste, the reflowed joint height of contact 28 will typically be between 0.002" and 0.006" (2 to 6 mils). The stencil design, the amount of solder remaining on 'ball-removed' CSPs, and flex planarity will be factors that could have a significant effect on this value. Low profile contact 28 has a height "C" which, in a preferred embodiment, is between 2 and 7 mils. Flex circuitry 32, with one or two or more conductive layers, has a thickness "F" of about 4 mils or less in a preferred embodiment. Adhesive layer 35 has a thickness "A1" of between 1 and 1.5 mils in a preferred embodiment. Form standard 34 has a thickness "FS" of between 4 and 6 mils in a preferred embodiment and, adhesive layer 36 has a thickness "A2" of between 1 and 2 mils. Thus, the total distance between lower surface 22 of CSP 16 and upper surface 20 of CSP 18 passing through one of low profile contacts 28 of CSP 16 is approximated by formula 1:

$$(C+F+A1+FS+A2)-\text{distance low profile contact 28 penetrates into flex 32.} \quad (1)$$

In practice, this should be approximately between 9 and 20 mils in a preferred embodiment. A similar calculation can be applied to identify the preferred distances between, for example, CSP 14 and CSP 16 in a four-high module 10. In such cases, the height of inter-flex contact 42 and thickness of another layer of flex circuit 32 will be added to the sum to result in a preferred range of between 13 and 31 mils. It should be noted that in some embodiments, not all of these elements will be present, and in others, added elements will be found. For example, some of the adhesives may be deleted, and form standard 34 may be replaced or added to with a heat spreader 37 and, in still other versions, neither a form standard 34 nor a heat spreader 37 will be found. As an example, where there is no use of a heat spreader 37 or form standard 34, the distance between lower surface 22 of CSP 16 and upper surface 20 of CSP 18 in a two-element module 10 will be preferably between 4.5 and 12.5 mils and more preferably less than 11 mils. It is often desirable, but not required, to create low profile contacts 28 and low profile inter-flex contacts 42 using HT joints as previously described.

Figure 13:
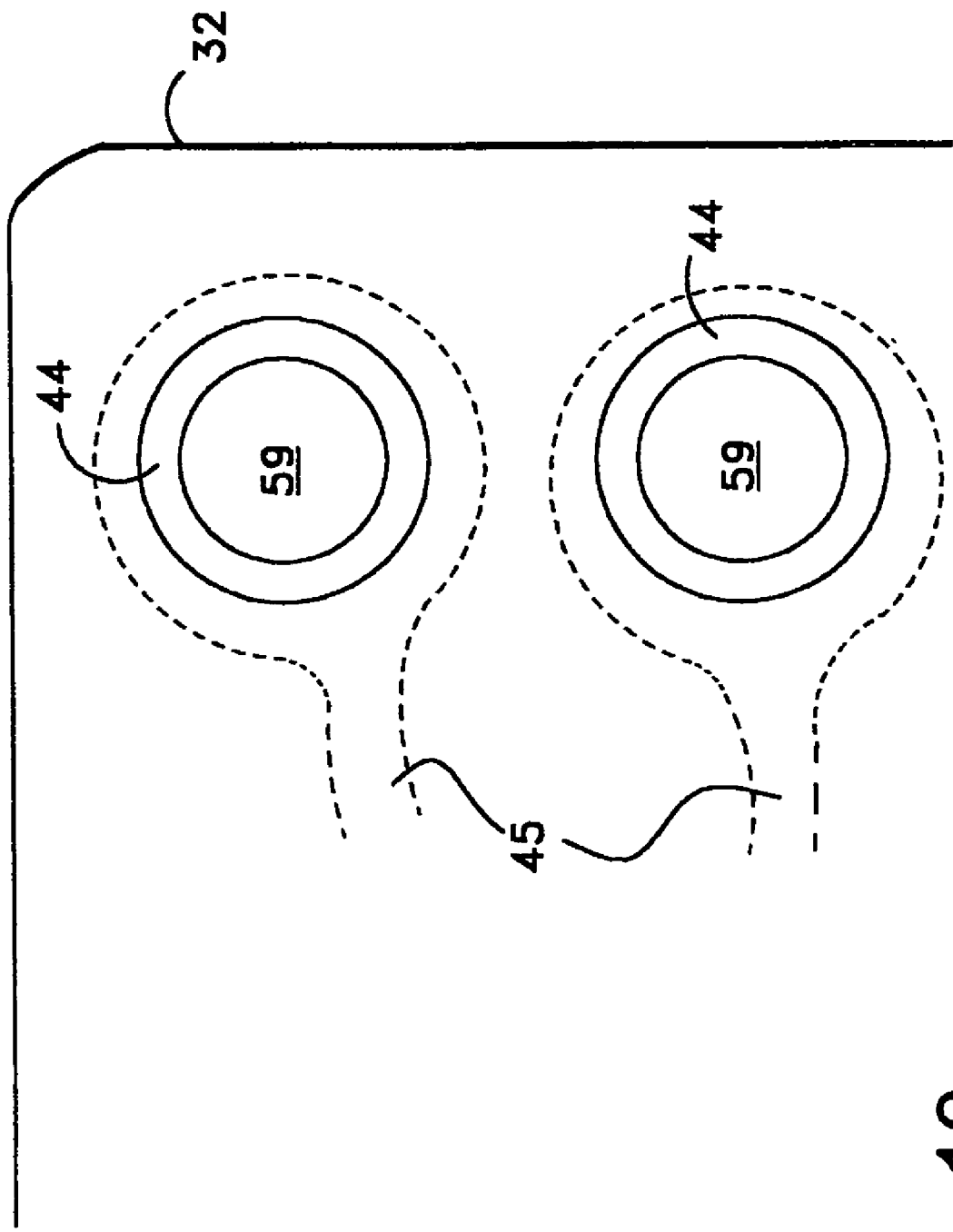
FIG. 13 depicts, in enlarged view, a portion of a flex circuitry employed with the structure of FIG. 11 in an alternative preferred embodiment of the present invention.

FIG. 13 depicts a plan view of a contact structure in flex 32 that may be employed to implement the consolidated contact 61 shown earlier in FIG. 11. Shown in FIG. 13 are two exemplar flex contacts 44 that each have an orifice 59. It may be considered that flex contacts 44 extend further than the part visible in this view as represented by the dotted lines that extend into traces 45. The part of flex contact 44 visible in this view is to be understood as being seen through windows in other layers of flex 32 as previously described, depending upon whether the flex contact is articulated at a first conductive layer or, if it is present in flex 32, a second conductive layer and intermediate layer and whether the flex contact is for connection to the lower one of two CSPs or the upper one of two CSPs in a module 10.

FIG. 14 depicts a flexible circuit connective set of flex circuits 30 and 32 that has a single conductive layer 64. It should be understood with reference to FIG. 13, that flex circuits 30 and 32 extend laterally further than shown and have portions which are, in the construction of module 10, brought about and disposed above the present, heat spreader 37, a form standard 34 (not shown), and/or upper surface 20 of CSP 18. In this single conductive layer flex embodiment of module 10, there are shown first and second outer layers 50 and 52 and intermediate layer 56.

Heat spreader 37 is shown attached to the body 27 of first level CSP 18 through adhesive 36. In some embodiments, a heat spreader 37 or a form standard 34 may also be positioned to directly contact body 27 of the respective CSP.

Heat transference from module can be improved with use of a form standard 34 or a heat spreader 37 comprised of heat transference material such as a metal and preferably, copper or a copper compound or alloy, to provide a significant sink for thermal energy. Although the flex circuitry operates as a heat transference material, such thermal enhancement of module 10 particularly presents opportunities for improvement of thermal performance where larger numbers of CSPs are aggregated in a single stacked module 10.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A method of devising a high-density circuit module comprising the steps of:
   providing a first-level CSP having contact sites along a major surface, an upper surface and a lower surface, and opposing lateral sides defining a lateral extent of the first-level CSP;
   providing a second-level CSP having contact sites along a major surface;
   attaching a form standard to the first-level CSP such that at least one curved portion of the form standard extends outside of the lateral extent of the first-level CSP to present an at least one curved outer surface, the form standard having a thickness of about 6 mils or less;

providing flex circuitry having an outer set of plural flex contacts, an inner set of plural flex contacts, and a thickness of about 4 mils or less;

disposing high-temperature solder paste on the contact sites of the first-level CSP;

applying heat sufficient to connect selected contact sites of the first-level CSP to select ones of the inner set of plural flex contacts to form a reflowed contact having a height between 2 and 6 mils;

wrapping the flex circuitry partially about the at least one curved outer surface of the at least one curved portion of the form standard such that the flex circuitry presents the outer set of plural flex contacts above the form standard and the inner set of plural flex contacts below a lower surface of the first-level CSP;

disposing high-temperature solder paste on the CSP contact sites of the second-level CSP; and applying heat sufficient to connect select ones of the second-level CSP contact sites to select ones of the outer set of plural flex contacts to form a reflowed contact having a height between 2 and 6 mils;

in which the flex circuitry comprises at least one flex circuit having first and second conductive layers, the first conductive layer being closer to the first-level CSP than is the second conductive layer subsequent to the step of wrapping the flex circuitry, between which layers there is an intermediate layer, the second conductive layer having demarked selected ones of the inner and outer sets of plural flex contacts.

2. A method of devising a high-density circuit module comprising the steps of:

providing a first-level CSP having contact sites along a major surface, an upper surface and a lower surface, and opposing lateral sides defining a lateral extent of the first-level CSP;

providing a second-level CSP having contact sites along a major surface;

attaching a form standard to the first-level CSP such that at least one curved portion of the form standard extends outside of the lateral extent of the first-level CSP to present an at least one curved outer surface, the form standard having a thickness of about 6 mils or less;

providing flex circuitry having an outer set of plural flex contacts, an inner set of plural flex contacts, and a thickness of about 4 mils or less;

disposing high-temperature solder paste on the contact sites of the first-level CSP;

applying heat sufficient to connect selected contact sites of the first-level CSP to select ones of the inner set of plural flex contacts to form a reflowed contact having a height between 2 and 6 mils;

wrapping the flex circuitry partially about the at least one curved outer surface of the at least one curved portion of the form standard such that the flex circuitry presents the outer set of plural flex contacts above the form standard and the inner set of plural flex contacts below a lower surface of the first-level CSP;

disposing high-temperature solder paste on the CSP contact sites of the second-level CSP; and applying heat sufficient to connect select ones of the second-level CSP contact sites to select ones of the outer set of plural flex contacts to form a reflowed contact having a height between 2 and 6 mils;

in which the flex circuitry comprises at least one flex circuit having first and second conductive layers, the first conductive layer being closer to the first-level CSP than is the second conductive layer subsequent to the step of wrapping the flex circuitry, between which layers there is an intermediate layer, the first conductive layer having demarked selected ones of the inner and outer sets of plural flex contacts.

3. A method of devising a high-density circuit module comprising the steps of:

providing a first-level CSP having a top major surface and a bottom major surface and contact sites along the bottom major surface;

providing a second-level CSP having contact sites along a major surface;

securing a flex support means to the top surface of the first-level CSP, the flex support means having a thickness of about 6 mils or less;

providing flex circuitry having an outer set of plural flex contacts, an inner set of plural flex contacts, and a thickness of about 4 mils or less;

disposing high-temperature solder paste on the first-level CSP contact sites;

applying heat sufficient to connect selected contact sites of the first-level CSP to select ones of the inner set of plural flex contacts to form a reflowed contact having a height between 2 and 6 mils;

wrapping the flex circuitry partially about the flex support means;

disposing high-temperature solder paste on the contact sites of the second-level CSP; and applying heat sufficient to connect selected contact sites of the second-level CSP to select ones of the outer set of plural flex contacts;

in which the flex circuitry comprises at least one flex circuit having first and second conductive layers, the first conductive layer being closer to the first-level CSP than is the second conductive layer subsequent to the step of wrapping the flex circuitry, between which layers there is an intermediate layer, the second conductive layer having demarked selected ones of the inner and outer sets of plural flex contacts.

4. A method of devising a high-density circuit module comprising the steps of:

providing a first-level CSP having a top major surface and a bottom major surface and contact sites along the bottom major surface;

providing a second-level CSP having contact sites along a major surface;

securing a flex support means to the top surface of the first-level CSP, the flex support means having a thickness of about 6 mils or less;

providing flex circuitry having an outer set of plural flex contacts, an inner set of plural flex contacts, and a thickness of about 4 mils or less;

disposing high-temperature solder paste on the first-level CSP contact sites;

applying heat sufficient to connect selected contact sites of the first-level CSP to select ones of the inner set of plural flex contacts to form a reflowed contact having a height between 2 and 6 mils;

wrapping the flex circuitry partially about the flex support means;

disposing high-temperature solder paste on the contact sites of the second-level CSP; and applying heat sufficient to connect selected contact sites of the second-level CSP to select ones of the outer set of plural flex contacts;

in which the flex circuitry comprises at least one flex circuit having first and second conductive layers, the first conductive layer being closer to the first-level CSP than is the second conductive layer subsequent to the step of wrapping the flex circuitry, between which layers there is an intermediate layer, the first conductive layer having demarked selected ones of the inner and outer sets of plural flex contacts.

5. A method of devising a high-density circuit module comprising the steps of:

provic a first CSP having a lateral extent defined by opposing lateral sides, and having a plurality of ball contacts disposed along a major surface;

providing flex circuitry having a plurality of selected flex contacts each penetrated by an open orifice;

disposing the first CSP proximal to the flex circuitry to place the plurality of ball contacts adjacent to the plurality of flex contacts;

applying heat sufficient to melt the plurality of ball contacts such that the ball contacts melt and reflow partially through respective ones of the open orifices to present outer contact surfaces; and attaching a second CSP to the flex circuitry in a stacked disposition above the first CSP;

in which the flex circuitry comprises at least one flex circuit having first and second conductive layers, the first conductive layer being closer to the first CSP than is the second conductive layer subsequent to the step of attaching a second CSP to the flex circuitry in a stacked disposition above the first CSP, between which first and second conductive layers there is an intermediate layer, the second conductive layer having demarked selected ones of the inner and outer sets of plural flex contacts.

6. A method of devising a high-density circuit module comprising the steps of:

providing a first CSP having a lateral extent defined by opposing lateral sides, and having a plurality of ball contacts disposed along a major surface;

providing flex circuitry having a plurality of selected flex contacts each penetrated by an open orifice;

disposing the first CSP proximal to the flex circuitry to place the plurality of ball contacts adjacent to the plurality of flex contacts;

applying heat sufficient to melt the plurality of ball contacts such that the ball contacts melt and reflow partially through respective ones of the open orifices to present outer contact surfaces; and attaching a second CSP to the flex circuitry in a stacked disposition above the first CSP;

in which the flex circuitry comprises at least one flex circuit having first and second conductive layers, the first conductive layer being closer to the first CSP than is the second conductive layer subsequent to the step of attaching a second CSP to the flex circuitry in a stacked disposition above the first CSP, between which first and second conductive layers there is an intermediate layer, the first conductive layer having demarked selected ones of the inner and outer sets of plural flex contacts.

* * * * *